United States Patent [19]
Tormey et al.

[11] Patent Number: 5,953,203
[45] Date of Patent: Sep. 14, 1999

[54] MULTILAYER CERAMIC CIRCUIT BOARDS INCLUDING EMBEDDED CAPACITORS

[75] Inventors: Ellen Schwartz Tormey, Princeton Junction; Ashok Narayan Prabhu, East Windsor; Attiganal Narayanaswamy Sreeram, Plainsboro, all of N.J.

[73] Assignees: Sarnoff Corporation, Princeton, N.J.; Sharp Corporation, Osaka, Japan

[21] Appl. No.: 08/812,151

[22] Filed: Mar. 6, 1997

[51] Int. Cl.$^6$ .................................. H01G 4/06; H01G 4/20
[52] U.S. Cl. ...................... 361/313; 361/320; 361/321.2; 156/89; 29/831
[58] Field of Search .................. 361/313, 301.4, 361/306.3, 311, 312, 320, 321.1–321.5, 322; 501/136, 134, 137, 138; 29/25.42, 831, 830; 252/62.3 R, 62.9 PZ, 62.3 Q; 156/89, 320; 428/209, 210, 212, 901, 432; 174/52.4

[56] References Cited

U.S. PATENT DOCUMENTS

| | | | |
|---|---|---|---|
| 3,878,443 | 4/1975 | Girard et al. | 361/320 |
| 3,968,412 | 7/1976 | Girard et al. | 361/320 |
| 4,061,584 | 12/1977 | Girard et al. | 361/320 |
| 4,450,240 | 5/1984 | Miyamoto et al. | 501/136 |
| 4,882,652 | 11/1989 | Furukawa et al. | 361/321.5 |
| 5,004,715 | 4/1991 | Hakotani et al. | 501/136 |
| 5,059,566 | 10/1991 | Kanai et al. | 501/138 |
| 5,256,469 | 10/1993 | Cherukuri et al. | 428/210 |
| 5,581,876 | 12/1996 | Prabhu et al. | 29/851 |
| 5,708,570 | 1/1998 | Polinski, Sr. | 361/762 |

Primary Examiner—Kristine Kincaid
Assistant Examiner—Anthony Dinkins
Attorney, Agent, or Firm—William J. Burke

[57] ABSTRACT

Embedded capacitors are formed in multilayer ceramic circuit boards by screen printing a capacitor ink sandwiched between conductor ink layers onto a green tape stack and covering the ink layer with one or two green tapes, and aligning the green tape layers, and firing. The green tapes are made of a mixture of a crystallizing glass, a non-crystallizing glass and an oxide filler which do not shrink in the x and y dimensions during firing. Thus the capacitors can be made to close tolerances.

18 Claims, 2 Drawing Sheets

MULTILAYER CERAMIC CIRCUIT BOARDS INCLUDING EMBEDDED CAPACITORS

This invention relates to multilayer ceramic printed circuit boards including co-fired passive components. More particularly, this invention relates to multilayer ceramic printed circuit boards including embedded capacitors and methods of making them.

BACKGROUND OF THE INVENTION

Low temperature multilayer ceramic circuit boards are known that are suitable for use with low melting temperature conductive metals, such as silver, gold and copper. They have a low thermal coefficient of expansion (TCE) and thus they may be compatible with silicon or gallium arsenide. The ceramic circuit boards are made from glasses that can be fired at low temperatures, i.e., less than 1000° C. The multilayer circuit boards are made in known manner by admixing suitable finely divided glass particles with organic materials, including resin, solvents, dispersants and the like, and casting the resultant slurry as a thin tape called green tape. A circuit may be screen printed onto the green tape using a conductive ink formulation comprising a conductive metal powder, an organic vehicle and a powdered glass, usually the same or a similar glass to that used to make the green tape.

When more than one green tape is to be stacked, via holes are punched into the tape which are filled with a via fill ink, made with conductive material, an organic vehicle and a glass, which will provide electrical contact between the circuits on the various green tape layers. The patterned green tapes are aligned and compressed or laminated under pressure prior to firing.

More recently, the multilayer ceramic circuit boards have been adhered to a metal support substrate to increase the strength of the multilayer board. The support board has a metal core that is coated with a bonding glass that adheres the ceramic tapes to the support substrate during co-firing. The use of a bonding glass has another advantage in that it greatly reduces the shrinkage of the green tapes during firing in the x and y dimensions, so that most of the shrinkage occurs only in the z, or thickness, dimension. This means that the printed circuits can be made with closer tolerances. The glasses used for the green tapes must have a TCE matched to the metal support however, to prevent delamination or cracking of the fired glass. Mixtures of crystallizable and non-crystallizable glasses, optionally including inorganic fillers, are also known that have the desired TCE characteristics.

Up to the present time, when multilayer ceramic circuit boards are to include passive components such as resistors or capacitors, discrete components have been mounted to the top of the fired boards, using solder or epoxy type adhesives to adhere the components to the multilayer ceramic. The addition of these components increases the number of steps needed to make these circuit boards, i.e., the components must be aligned and adhered to the ceramic multilayer board, and connected to a source of power. Further, in order to accommodate a number of discrete devices, the multilayer boards have to be large. Thus the costs of making such boards is high.

It would be advantageous to be able to screen print passive components onto multilayer, low temperature co-fired ceramic circuit boards because the packing density can be increased, reducing the size and cost of the packaging. Using the recently developed low firing temperature glasses and a metal support board that reduce shrinkage in the x and y dimensions, screen printing of such components to tight tolerances, and high precision placement, become feasible. Further, because fewer interconnects need to be made, reliability would also be improved.

In a copending application filed concurrently herewith, the present inventors have interleaved two types of green tapes so that large numbers of green tapes can be stacked without shrinkage in two dimensions.

Thus it would be highly desirable to develop appropriate inks that can be screen printed onto green tape layers to form embedded capacitors to tight tolerances with high precision placement.

SUMMARY OF THE INVENTION

We have found a method of making thick film capacitor links based on barium titanate and lead magnesium niobate dielectrics which, when combined with appropriate glasses, sinter at low temperatures. The capacitors can be made in a wide range of dielectric constant. The capacitor inks can be screen printed onto ceramic green tapes and connected to a silver conductor layer by means of vias in the green tape that are filled with appropriate conductive inks. After printing the capacitors and other circuitry, the multiple green tape layers are aligned, laminated together and co-fired in air at a temperature of about 850–900° C.

Shunt capacitors can also be made by using a ground plane metal as the bottom capacitor plate. The capacitors are located one or two layers from the top of the green tape stack.

The embedded capacitors of the invention are made by screen printing capacitors from a capacitor ink onto stacked green tape layers on a metal support substrate one or two layers from the top of the stack; capacitors are terminated by screen printing a conductive layer over and under the printed capacitor (dielectric) ink.

DETAILED DESCRIPTION OF THE INVENTION

Figure 2:
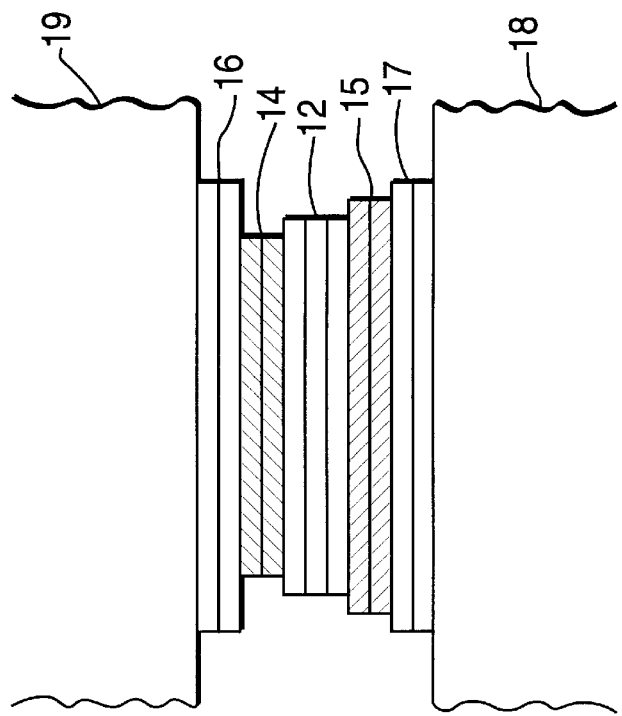
FIG. 2 is a cross sectional view of one embodiment of a buried capacitor of the invention.

We have discovered low dielectric constant, i.e., K=about 50–700, capacitor dielectric inks based on barium titanate powders. These powders sinter at high temperatures, about 1100–1300° C., and thus they must be modified by combining them with low melting glasses so that the resultant composition will sinter at lower temperatures of about 850–900° C., to adjust the dielectric constant (K) and to minimize the temperature coefficient of capacitance (TCC).

Barium titanate is commercially available from the Degussa Company under the trade name AD302L, (designated below as D); and a mixture of barium titanate and barium tin oxide is available from the Ferro Corporation under the trade name YL12000 (designated below as F). The properties of these powders are set forth below in Table I, wherein K is dielectric constant, dielectric loss is given as Tanδ, and temperature is in degrees Centigrade. Particle size is given as average particle size (Av. Part. Size) in microns.

TABLE I

| Composition | K | Tan δ | TCC, % | Firing T, °C. | Av. Part. Size, μm |
|---|---|---|---|---|---|
| F | 12000 | 0.022 | −80* | 1200 | 1.0 |
| D | 3200 | <0.02 | −9** | 1140 | 0.6 |

*RT to 125° C.
**85° C.

Prior to making capacitor ink compositions, the barium titanate powder was mixed with various low firing temperature glasses. The compositions of suitable glasses, in weight percent, is given below in Table II.

TABLE II

| Oxide | Glass 1 | Glass 2 | Glass 3 | Glass 4* | Glass 5 | Glass 6 |
|---|---|---|---|---|---|---|
| $Al_2O_3$ | 6.00 | 10.10 | | | 1.0 | 1.82 |
| BaO | | | | <2.0 | | |
| $B_2O_3$ | 39.00 | | 19.60 | >5.0 | 5.0 | 8.18 |
| $Bi_2O_3$ | | | | 23.0 | | |
| CaO | 5.00 | | | | | |
| CdO | | | | 36.0 | | |
| MgO | | | 24.50 | | | |
| PbO | | 50.00 | | >70.0 | 25.0 | 68.82 |
| $SiO_2$ | | 39.90 | 24.50 | <2.0 | 5.0 | 2.23 |
| $TiO_2$ | | | | | | 9.09 |
| ZnO | 50.00 | | 29.40 | >12.0 | 5.0 | 9.09 |
| $ZrO_2$ | | | | | | 2.73 |
| Particle Size, μm | 11–13 | 5–7 | 10–12 | 5.0 | 5.0 | 4.0 |

*Commercially available glass as SCC-11 from Sem Com, Inc., Toledo, OH

Representative low dielectric constant capacitor inks were made from barium titanate powder admixed with various glasses and glass mixtures, together with conventional dispersants, resin and solvent, and screen printed onto green tapes. The ink compositions are summarized in Table III below wherein the glass compositions are as shown in Table II.

TABLE III

| $BaTiO_2$ Type | Wt % | Glass # | Wt % % | Dispersant Wt % | Resin Wt % | Solvent Wt % |
|---|---|---|---|---|---|---|
| F | 62.29 | 1 | 7.14 | 1.43 | 4.07 | 23.07 |
| F | 66.09 | 1 | 8.25 | 1.52 | 4.84 | 19.38 |
| F | 64.89 | 2 | 9.8 | 1.49 | 4.76 | 19.05 |
| D | 65.62 | 1 | 13.52 | 1.57 | 4.83 | 14.48 |
| D | 59.99 | 1 | 3.08 | 1.44 | 4.45 | 21.04 |
| D | 62.27 | 2 | 12.15 | 1.54 | 4.41 | 17.83 |
| D | 60.86 | 2 | 15.34 | 1.52 | 4.46 | 17.82 |
| D | 60.10 | 3 | 14.84 | 1.50 | 4.71 | 18.85 |
| D | 57.05 | 2 $SrZrO_3$ | 15.35 3.76 | 1.54 | 4.46 | 17.84 |
| D | 59.15 | 2 $SrTiO_3$ | 15.38 1.57 | 1.54 | 4.47 | 17.89 |
| D | 58.88 | 2 $SrZrO_3$ | 15.33 1.94 | 1.53 | 4.48 | 17.85 |
| D | 62.25 | 2 | 14.04 | 1.56 | 4.43 | 17.73 |
| D | 63.61 | 2 | 12.79 | 1.53 | 4.41 | 17.66 |

The capacitor inks can be screen printed onto green tapes formulated for co-firing onto metal, particularly kovar, support substrates. The primary crystallizing glass used is made from a mixture of the following oxides: 29.4% of ZnO, 24.5% of MgO, 19.6% of $B_2O_3$, 24.5% of $SiO_2$, and 2.0% of $Co_3O_4$, all % by weight. Typical green tape compositions are given below in Table IV.

TABLE IV

| Additive | Function | Amount, wt % Green tape 1 | Amount, wt % Green tape 2 |
|---|---|---|---|
| Glass | Primary Crystallizing Glass | 57.34 | 57.29 |
| Glass P12[1] | Secondary Non-Crystallizing Glass | 6.98 | 7.03 |
| Forsterite[2] Powder | Ceramic Filler | 7.27 | 4.42 |
| Cordierite[3] Powder | Ceramic Filler | 1.09 | 3.44 |
| Hypermer PS2[4] | Dispersant | 0.58 | 0.58 |
| Butvar B98[5] | Binder | 2.04 | 2.04 |
| Santicizer 160[6] | Plasticizer | 1.36 | 1.36 |
| Methyl Ethyl Ketone | Solvent | 11.67 | 11.67 |
| Anhydrous Ethanol | Solvent | 11.67 | 11.67 |

[1]Glass composition (wt %) 10.0% $Al_2O_3$, 42.0% PbO, 38.0% $SiO_2$, 10.0% ZnO
[2]3–5 μm median particle size
[3]2–3 μm median particle size
[4]Registered trademark of ICI Americas, Inc.
[5]Registered trademark of Monsanto Co.
[6]Registered trademark of Monsanto Co.

The capacitor inks were screen printed onto the above green tapes in square capacitor patterns 1.27, 2.54 and 5.08 mm in size. Three four-layer green tapes were made with the capacitor ink layer one layer from the top of the stack. The green tapes were laminated at 278 psi and co-laminated to a kovar substrate at 347 psi. A silver-based powder or silver flake-based conductor ink was buried to make a buried co-fired capacitor. Suitable conductor ink compositions are set forth in Table V.

TABLE V

| Component | Ink 1 | Ink 2 | Ink 3 | Ink 4 |
|---|---|---|---|---|
| Silver Powder[1] | 83.78 | | | 20.11 |
| Silver-Palladium Powder[1] | | 84.93 | | |
| Silver Flake[1] | | | 80.97 | 60.30 |
| Glass 3 | 0.65 | | | |
| Dispersant | 1.22 | 1.32 | 0.53 | 1.21 |
| Resin[2] | 0.88 | 0.86 | 0.46 | 0.46 |
| Resin[3] | | | 1.85 | 1.84 |
| Resin[4] | 0.80 | 0.79 | | |
| Texanol Solvent | 3.22 | 3.25 | | |
| Terpineol Solvent | 6.81 | 6.73 | 6.48 | 6.44 |
| Butyl Carbitol | 2.54 | 2.12 | 9.71 | 9.66 |

[1]Available from Degussa Corporation, So. Plainfield, NJ
[2]Ethyl Cellulose Resin N300
[3]Ethyl Cellulose Resin N14
[4]Elvacite 2045

The resultant laminated stack was fired at 850° C. The capacitance and dielectric loss (tanδ) were measured at 10 KHz. The dielectric constant for each capacitor was calculated from the measurement of capacitance (C) in pF, the area (A) of the capacitor in square centimeters, and the thickness (t) in centimeters, in accordance with the equation $$K = \frac{Ct}{A\varepsilon_0}$$

wherein $\varepsilon_0$ is a constant=0.0885 pF/cm. These capacitor inks were suitable for operation at high frequency (1 GHz). The capacitor sizes and property measurements are given below in Table VI, wherein the thickness is for the fired capacitor, capacitance is measured as pF/mm², dielectric loss is given as tanδ, K is dielectric constant, and TCC is given in ppm/°C. from room temperature to 125° C. In Table VI, the glass is given in volume % except as otherwise noted.

TABLE VI

| Capacitor Composition | Size, mm | Thick. μm | pF/mm² | Tan δ | K | TCC |
|---|---|---|---|---|---|---|
| F + 13.4% Glass 1 | 1.27 | 32 | 23.0 | 0.010 | 83 | −115 |
|  | 5.08 | 32 | 18.9 | 0.011 | 68 | 515 |
| F + 15% Glass 1 | 1.27 | 32 | 22.1 | 0.007 | 80 | 582 |
|  | 5.08 |  | 20.6 | 0.012 | 74.5 | 689 |
| F + 15% Glass 2 | 1.27 | 30 | 10.5 | 0.007 | 36 | 878 |
|  | 5.08 |  | 9.3 | 0.008 | 31.4 |  |
| D + 25% Glass 1 | 1.27 | 32 | 16.1 | 0.002 | 59 |  |
|  | 5.08 |  | 14.9 | 0.002 | 56 |  |
| D + 26% Glass 1 | 1.27 | 32 | 13.5 | 0.003 | 48.5 | −1136 |
|  | 5.08 |  | 10.7 | 0.001 | 38.5 | 37 |
| D + 20% Glass 2 | 1.27 | 33 | 30.4 | 0.007 | 114 | −264 |
| D + 25% Glass 2 | 1.27 | 32 | 15.3 | 0.002 | 55 | −560 |
|  | 5.08 |  | 12.7 | 0.004 | 46 | −342 |
| D + 30% Glass 3 | 1.27 | 30 | 13.3 | 0.002 | 45 | −918 |
|  | 5.08 |  | 9.8 | 0.002 | 33 | 34 |
| D + 25% Glass 2 + 6.6 Wt % SrZrO₃ | 1.27 | 29 | 40.5 | 0.009 | 131 | 61 |
|  | 5.08 |  | 38.6 | 0.008 | 125 | 360 |
| D + 25% Glass 2 + 2.7 Wt % SrZrO₃ | 1.27 | 34 | 14.8 | 0.003 | 57 | −756 |
|  | 5.08 |  | 10.9 | 0.003 | 42 | 193 |
| D + 25% Glass 2 + 3.3 Wt % SrZrO₃ | 1.27 | 31 | 20.7 | 0.005 | 72.5 | −119 |
|  | 5.08 |  | 15.7 | 0.005 | 55 | 579 |

Additional low dielectric constant capacitor inks made of barium titanate were screen printed to form capacitors of various sizes, laminated at 1670 psi, terminated with a silver ink layer, co-laminated to kovar at 1740 psi, and fired at 865° C. Several screen printings were applied to produce a minimum thickness of the fired capacitor. The composition, size and fired properties are summarized below in Table VII wherein the glass is given in volume %.

TABLE VII

| Composition | Thick μm | Size mm | pF/mm² | K | Tan δ | TCC |
|---|---|---|---|---|---|---|
| 25% Glass 2 | 39 | 1.27 | 15.7 | 71 | 0.004 | −127 |
|  |  | 2.54 | 13.0 | 56 | 0.004 | 201 |
|  |  | 5.08 | 12.6 | 55 | 0.004 | 348 |
| 25% Glass 2 + 3.3 Wt % SrZrO₃ | 32 | 1.27 | 22.7 | 84 | 0.007 | 70 |
|  |  | 2.54 | 20.0 | 71 | 0.006 | 313 |
|  |  | 5.08 | 20.5 | 74 | 0.006 | 453 |
| 23% Glass 2* | 32 | 1.27 | 19.7 | 71 | 0.003 | −118 |
|  |  | 2.54 | 16.2 | 58 | 0.003 | 185 |
|  |  | 5.08 | 15.2 | 55 | 0.003 | 296 |
| 21% Glass 2 | 35 | 1.27 | 25.0 | 99 | 0.004 | −69 |
|  |  | 2.54 | 22.4 | 89 | 0.004 | 242 |
|  |  | 5.08 | 22.1 | 90 | 0.004 | 365 |

TABLE VII-continued

| Composition | Thick μm | Size mm | pF/mm² | K | Tan δ | TCC |
|---|---|---|---|---|---|---|
| 30% Glass 2 | 35 | 1.27 | 14.8 | 59 | 0.002 | 271 |
|  |  | 2.54 | 12.9 | 51 | 0.003 | 360 |
|  |  | 5.08 | 12.6 | 50 | 0.004 | 411 |

*IR was measured to be $1.4 \times 10^{12}$ ohms.

Figure 1:
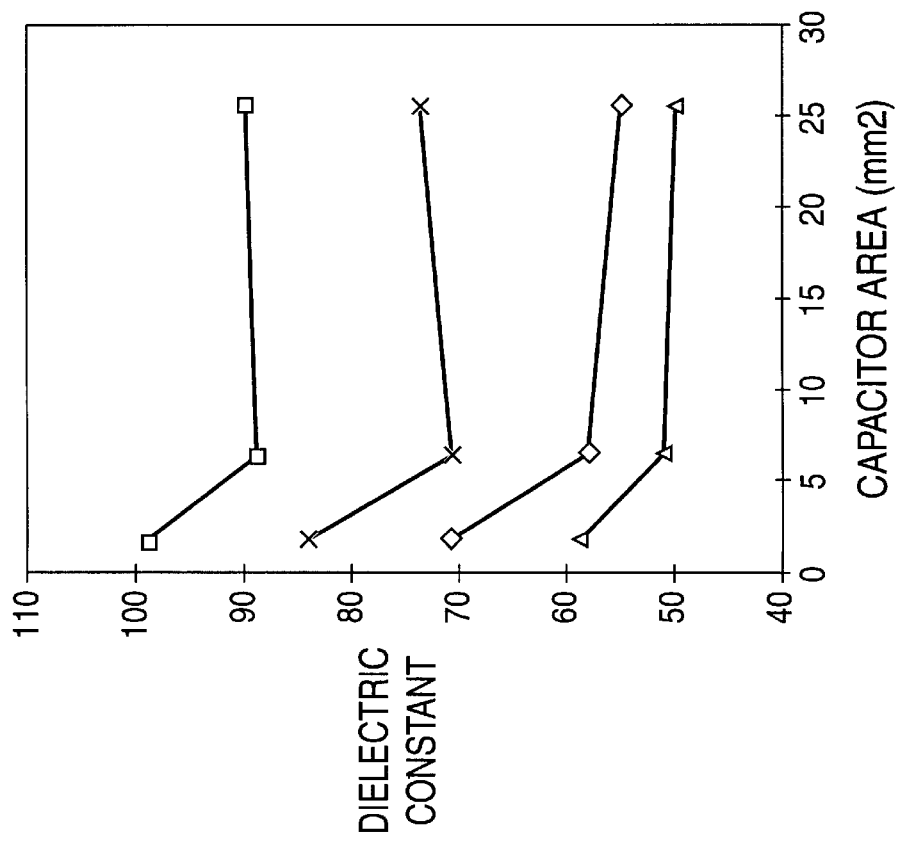
FIG. 1 is a graph of dielectric constant versus capacitor size for low dielectric constant inks.

It is apparent that there is a size dependence of capacitance per unit area and dielectric constant for buried capacitors and TCC values. In general, dielectric constant decreases with an increase in capacitor size, as shown in FIG. 1, whereas TCC shows more positive capacitance. The smaller the capacitor, the higher the capacitance, which may be due to fringing capacitance effects and to interaction between capacitors and the surrounding ceramic layers.

Designing high dielectric constant buried co-fired capacitors (K=1500) however, is a much more difficult problem. Since the capacitor dielectric materials have a high sintering temperature, the low firing temperature used with the present green tapes results in a porous dielectric; the mixture of barium titanate with a low firing temperature glass dilutes the dielectric constant; the surrounding low dielectric constant glass-ceramics diffuse into the capacitor, resulting in further dilution effects; and the diffusion of silver metal into the capacitor also dilutes the dielectric constant. Thus the resultant buried capacitors based on barium titanate were limited to K values of no more than 700, as shown in Tables VIII and IX.

Table VIII summarizes capacitor properties for buried BaTiO₃-based capacitor inks using a silver powder conductor layer. Green tape and capacitor layers were laminated at 280 psi and fired at 850° C. The glass is given in volume %.

TABLE VIII

| Composition | Thick, μm | Size, mm | pF/mm² | K | Tan δ | TCC |
|---|---|---|---|---|---|---|
| 7.5 vol % Glass 4* | 29 | 1.27 | 123.4 | 404 | 0.005- |  |
|  |  | 2.54 | 120.2 | 394 | 0.007 |  |
|  |  | 5.08 | 107.5 | 352 |  |  |
| Same | 29 | 1.27 | 221.3 | 725 | 0.008 | 259 |
|  |  | 2.54 | 193.6 | 634 | 0.007 | 313 |
|  |  | 5.08 | 187.9 | 615 | 0.007 | 305 |

The above capacitors were made with a capacitor dielectric ink applied above and below the conductor pads as a barrier.

| 7.5 Vol % Glass 4** | 29 | 1.27 | 167.4 | 549 | 0.008 | 335 |
|  |  | 2.54 | 151.3 | 496 | 0.008 | 423 |
|  |  | 5.08 | 154.1 | 505 | 0.008 | 433 |
| 7.5 Vol % PbTiO₃/Bi₂O₃ | 26 | 1.27 | 150.0 | 441 | 0.014 |  |
|  |  | 5.08 | 131.2 | 385 | 0.013 |  |
| 8.8 Vol % Glass 5** | 32 | 1.27 | 158.7 | 574 | 0.009 | 625 |
|  |  | 5.08 | 160.0 | 586 | 0.010 | 550 |

*using silver powder as the conductor
**using silver-palladium powder as the conductor The following capacitors were made by laminating green tape and capacitors at 1670 psi and firing at 865° C. The silver conductor used was silver flake. The glass is given as volume %.

TABLE IX

| Composition | Thick, μm | Size, mm | pF/mm² | K | Tan δ | TCC |
|---|---|---|---|---|---|---|
| 7.5% Glass 4* | 27.4 | 1.27 | 215.9 | 668 | 0.007 | 104 |
|  |  | 2.54 | 197.9 | 612 | 0.007 | 56 |
|  |  | 5.08 | 214.5 | 664 | 0.007 | −173 |

TABLE IX-continued

| Composition | Thick, μm | Size, mm | pF/mm² | K | Tan δ | TCC |
|---|---|---|---|---|---|---|
| 8.8% Glass 5** | 27.2 | 1.27 | 223.2 | 686 | 0.010 | 166 |
| | | 2.54 | 220.2 | 677 | 0.010 | 39 |
| | | 5.08 | 222.4 | 600 | 0.010 | −130 |
| 7.5% PbTiO₃/ | 25.6 | 1.27 | 198.7 | 575 | 0.010 | |
| Bi₂O₃ | | 2.54 | 186.5 | 540 | 0.010 | |
| | | 5.08 | 183.6 | 531 | 0.009 | |

*IR was $4.7 \times 10^{10}$ ohms
**IR was $5.1 \times 10^{10}$ ohms

The above capacitor compositions were tailored to promote sintering at low temperatures with a minimum dilution of the dielectric constant and to contain less than 10 volume percent of low melting oxides or glass additives made from PbO, Bi₂O₃, ZnO, CdO or PbTiO₃ materials that are soluble in the BaTiO₃ perovskite lattice structure. However, these represent fired compositions having a maximum dielectric constant of about 700.

Thus, in order to achieve higher dielectric constants for buried co-fired capacitors (K>1000), we have found that lead-magnesium-niobate-based (PMN) compositions must be used. Suitable high dielectric constant capacitor ink compositions based on PMN are summarized below in Table X, wherein % is by weight.

TABLE X

| % PMN | Additives | % | Dispersant | Resin | Solvent |
|---|---|---|---|---|---|
| 75.02 | Glass 4 | 5.33 | 1.65 | 3.33 | 13.32 |
| | BaTiO₃ | 1.35 | | | |
| 76.88 | Glass 4 | 3.97 | 1.61 | 3.31 | 13.32 |
| | BaTiO₃ | 1.01 | | | |
| 74.16 | PbTiO₃ | 6.01 | 1.65 | 3.28 | 13.11 |
| | PbO | 1.60 | | | |
| | MgO | 0.20 | | | |
| 74.93 | Glass 5 | 5.49 | 1.65 | 3.32 | 13.27 |
| | BaTiO₃ | 1.35 | | | |
| 74.93 | Glass 6 | 5.12 | 1.65 | 3.32 | 13.27 |
| | PbTiO₃ | 1.72 | | | |
| 74.70 | Glass 5 | 5.48 | 1.64 | 3.29 | 13.15 |
| | PbTiO₃ | 1.74 | | | |

Using the above lead-magnesium-niobate-based capacitor inks and co-firing on alumina support substrates produced K values of over 2000 with a silver powder conductor ink. However, when buried in green tape laminates on KOVAR® support substrates, the K values were dramatically lowered to about 30–50 due to the dilution effects discussed above. In order to obtain high dielectric constant capacitors on kovar, a barrier layer can be used to block the diffusion of the ceramics into the capacitors during co-firing. This barrier layer can be of a more effective silver metal composition, or of a different dielectric material.

We have found that a BaTiO₃ based capacitor ink can be used as a barrier material when a very low melting glass, lower melting than the glass used in the green tape layers, is used. This barrier glass densifies and crystallizes at a lower temperature than that required for the green tape glasses to soften significantly. Thus the barrier glass blocks the diffusion of the green tape glasses into the capacitor. In such case the barrier is printed as a pad larger than the capacitor, both below the bottom conductor pad and above the top conductor pad, as shown in FIG. 2. In FIG. 2, a three layer capacitor 12 having a two layer top and bottom conductor layers 14 and 15 respectively is sandwiched between two top and bottom two-layer barrier layers 16 and 17 respectively. A metal support 20 is laminated to the green tape stack 19. The buried capacitor is in turn laminated to top and bottom green tape layers 18 and 19 respectively.

Using a capacitor ink including Glass 6 and 71.07 percent of BaTiO₃, as described above, a barrier layer was printed as a pad 19×19 mm, centered about a capacitor 5.08×5.08 mm made from a PMN ink including 74.16% of PMN. Silver powder was used to make the conductor ink. Various layers were employed to determine how many barium titanate barrier layers were required to obtain a high dielectric constant capacitor on a kovar supported multilayer circuit board. Controls without the barrier layers were also tested. The test results are given below in Table XI wherein the number of prints refers to the number of screen prints used for each layer.

TABLE XI

| Function | # Prints | Thick. μm | pF/mm² | K | Tan δ | TCC | IR (Ω) × 10¹⁰ |
|---|---|---|---|---|---|---|---|
| Barrier | 3 | 24 | | | | | |
| Conductor | 1 | | | | | | |
| Capacitor | 3 | 55 | 181.3 | 1132 | 0.017 | | |
| Control 1 | | 58 | 5.1 | 34 | | | |
| Barrier | 3 | 24–28 | | | | | |
| Conductor | 2 | 10 | | | | | |
| Capacitor | 3 | 36 | 751.6 | 3058 | 0.038 | −19.6 | |
| Control 2 | | 35 | 208.0 | 823 | 0.022 | −9.5 | |
| Barrier | 1 | 10 | | | | | |
| Conductor | 2 | 11 | | | | | |
| Capacitor | 3 | 46 | 91.8 | 493 | 0.009 | −17.5 | 8.3 |
| Control 3 | | 53 | 128.2 | 689 | 0.022 | −8.5 | 6.4 |
| Barrier | 2 | 32 | | | | | |
| Conductor | 2 | 11 | | | | | |
| Capacitor | 3 | 36 | 360.0 | 1463 | 0.033 | −21.5 | 2.3 |
| Control 4 | | 31 | 219.0 | 766 | 0.024 | −4.2 | 3.8 |

Thus when a minimum thickness barrier layer is present, the dielectric constant was much higher than when no barrier layer, or a thin barrier layer, was used. Buried capacitors having a high dielectric constant were achieved however using a double metallization print, and a double barrier layer print. By increasing the number of barrier prints to three on either side of the conductive layers, dielectric constant (K) values above 3000 were obtained. However, while high dielectric constant capacitors can be made via the above process, several extra printing steps are required, and the barrier thickness must be about 16–20 microns to be effective.

However, due to the thickness of the several barrier layers, conductive layers and capacitor layers, the top green tape layer is subject to tearing and care must be taken to prevent that. Further, the large number of screen printing steps required (up to eleven as described above) adds to the costs of the process.

Thus a modified buried conductor ink was sought that would be a more effective barrier, one that would require fewer printing steps and have a reduced thickness that would not subject the top green tape layer to tearing.

We have further found that a mixture of silver flake and silver powder as the conductive layer makes very effective barrier layers, better than those using either silver flake or silver powder alone. Silver powder inks produce low dielectric constant capacitors. Using silver flake alone formed a very effective barrier layer (K=3600) but it resulted in tearing of the overlying green tape layer during lamination or firing. Thus a mixture of 75% by weight of silver flake and 25% by weight of silver powder, although not as effective as a barrier as silver flake alone, resulted in high dielectric constant capacitors. However, outgassing of capacitors is a problem during firing. If the silver metal seals the capacitor too well, the gases formed from the additives (PbO containing) materials cannot escape. Thus the silver flake, while it results in a high dielectric constant capacitor, forms a structure that becomes too dense during firing, and leads to tearing in the overlying green tapes. Thus the use of a mixture of silver powder and silver flake, although a compromise in terms of dielectric constant, does not tear the top green tape layer nor do these structures have outgassing or bubbling problems.

A plurality of buried PMN-based capacitors on kovar substrates were made using silver powder, silver flake and a mixed silver powder and silver flake conductor layer. The layers were laminated at 1670 psi and fired at 865° C. The test results are summarized below in Table XII.

TABLE XII

| Silver Type | # Prints/ Thick | Thick $\mu m$ | Size mm | pF/mm$^2$ | K | Tan δ | TCC |
|---|---|---|---|---|---|---|---|
| powder | 2/10–11 $\mu m$ | 31 | 1.27 | 14.6 | 51 | 0.001 | –2.0 |
|  |  |  | 2.54 | 27.7 | 97 | 0.010 |  |
|  |  |  | 5.08 | 112.6 | 394 | 0.018 | –6.9 |
| powder | 2/13 $\mu m$ | 35 | 1.27 | 60.9 | 246 | 0.009 | 11.4 |
|  |  |  | 2.54 | 230 | 908 | 0.021 | –16.5 |
|  |  |  | 5.08 | 482.5 | 1581 | 0.045 | –27.6 |
| flake | 2/10 $\mu m$ | 29 | 1.27 | 447 | 1465 | 0.027 | –21.7 |
|  |  |  | 2.54 | 716 | 2346 | 0.037 | –27.6 |
|  |  |  | 5.08 | 1099 | 3601 | 0.040 | –30.1 |
| flake | 1/5 $\mu m$ | 21 | 1.27 | 383 | 928 | 0.018 | –30.8 |
|  |  |  | 2.54 | 841.4 | 1967 | 0.027 | –38.1 |
|  |  |  | 5.08 | 1050 | 2498 | 0.026 | –41.9 |
| Mixed | 1/6 $\mu m$ | 29 | 1.27 | 228.2 | 748 | 0.023 | –30.8 |
|  |  |  | 2.54 | 477 | 1564 | 0.033 | –39.8 |
|  |  |  | 5.08 | 706 | 2313 | 0.045 | –44.7 |
| Mixed | 2 bott/6.5 1 top/3.2 $\mu m$ | 29 | 1.27 | 624 | 2043 | 0.025 | –42.7 |
|  |  |  | 2.54 | 931 | 3052 | 0.037 | –49.1 |
|  |  |  | 5.08 | 1005 | 3295 | 0.048 | –51.8 |

Insulation Resistance (IR) of the first capacitor of 5.08 mm size was $3.8 \times 10^{10}$ ohms. IR of the second capacitor of 5.08 mm size using silver flake was $6.0 \times 10^{10}$ ohms. The IR of the first capacitor using the mixed silver and the same size was $1.0 \times 10^{10}$ ohms.

The above buried capacitors made with the mixture of silver flake and silver powder as the conductor layer, required fewer printing steps and fired without any problems with bubbling or outgassing. No tearing of the overlying green tape layer was noted.

Figure 4:
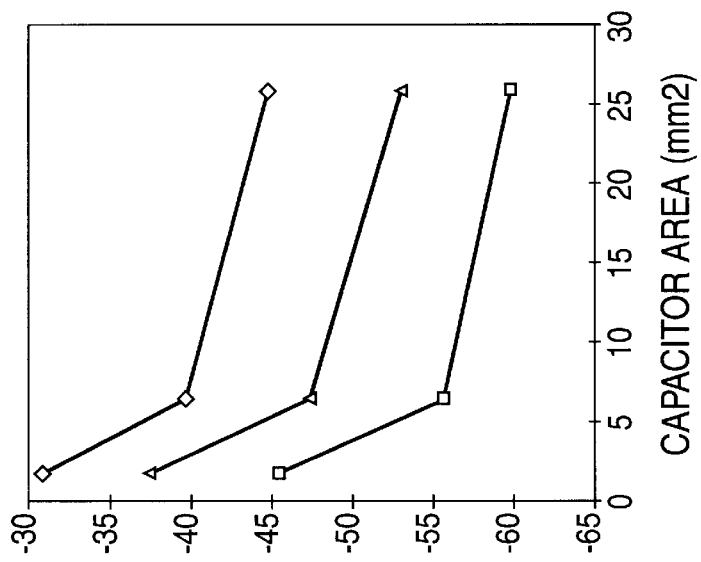
FIG. 4 is a graph of temperature coefficient of capacitance versus capacitor size for capacitors of the invention.
Figure 3:
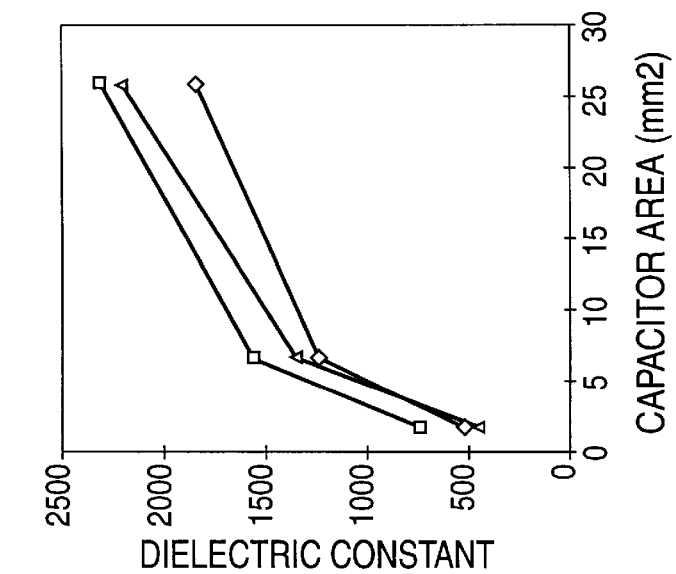
FIG. 3 is a graph of dielectric constant versus capacitor size for capacitors of the invention.

The dielectric constant of the PMN capacitors exhibit a large size dependence; i.e., the dielectric constant increases with increasing capacitor size, and TCC also increases (becomes more negative) with increasing capacitor size. It is believed this is a result of dilution of the capacitor dielectric by the surrounding low dielectric constant ceramic. Large capacitors have less dilution effect than small capacitors. This is shown in Table XIII below, and schematically in FIGS. 3 and 4, graphs of dielectric constant and TCC versus capacitor size, respectively. In Table XIII the capacitors are based on PMN with mixed silver powder-silver flake inks.

TABLE XIII

| Capacitor Composition | Fired Thk. $\mu m$ | Size mm | pF/ mm$^2$ | K | Tan δ | TCC | IR (Ω) × 10$^{10}$ |
|---|---|---|---|---|---|---|---|
| 10% Glass 4 + BaTiO$_3$ | 22.4 | 1.27 | 205 | 518 | 0.015 | –45.5 |  |
|  |  | 2.54 | 496 | 1259 | 0.018 | –55.6 |  |
|  |  | 5.08 | 728 | 1844 | 0.019 | –59.7 | 1.9 |
| 7.5% Glass 4 + BaTiO$_3$ | 31 | 1.27 | 116 | 400 | 0.011 | –38.4 |  |
|  |  | 2.54 | 334 | 1154 | 0.017 | –50.3 |  |
|  |  | 5.08 | 607 | 2098 | 0.022 | –57.3 |  |

TABLE XIII-continued

| Capacitor Composition | Fired Thk. $\mu m$ | Size mm | pF/ mm$^2$ | K | Tan δ | TCC | IR (Ω) × 10$^{10}$ |
|---|---|---|---|---|---|---|---|
| 10% Glass 5 + BaTiO$_3$ | 24 | 1.27 | 173 | 456 | 0.007 | –37.6 |  |
|  |  | 2.54 | 508 | 1367 | 0.008 | –47.3 |  |
|  |  | 5.08 | 821 | 2209 | 0.009 | –52.9 | 1.5 |
| 10% Glass 6 + BaTiO$_3$ | 30 | 1.27 | 227 | 484 | 0.014 | –24.2 |  |
|  |  | 2.54 | 253 | 870 | 0.016 | –33.6 |  |
|  |  | 5.08 | 372 | 1279 | 0.018 | –38.4 |  |
| 10% Glass 6 + PbTiO$_3$ | 25 | 1.27 | 68 | 196 | 0.011 | –18.1 |  |
|  |  | 2.54 | 216 | 620 | 0.016 | –24.8 |  |
|  |  | 5.08 | 329 | 944 | 0.019 | –27.1 |  |

Intermediate range (K=500–700) barium titanate-based buried capacitors fabricated with the same mixed silver flake/powder conductor layers which were also laminated at 1670 psi and fired at 865° C. are not as size dependent.

Figure 5:
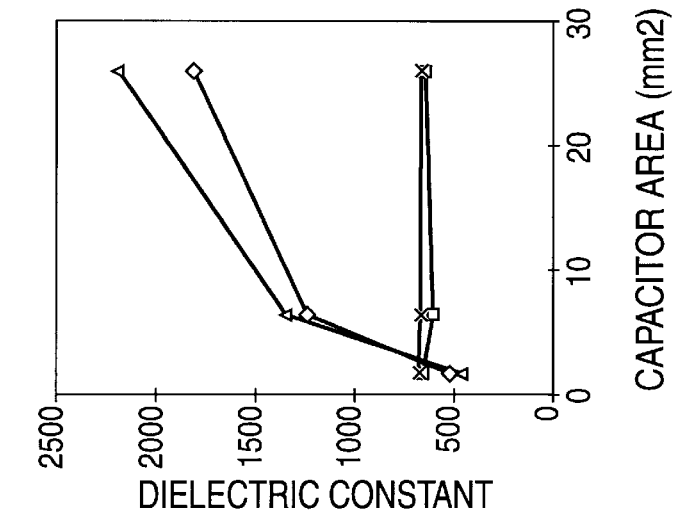
FIG. 5 is a graph of dielectric constant versus capacitor size for capacitors of the invention.

FIG. 5, which is a graph of dielectric constant versus capacitor size using a mixed silver conductor, illustrates the differences in the size dependence of barium titanate-based capacitors and PMN-based capacitors. Thus, for applications requiring intermediate dielectric constant values, barium titanate-based buried capacitors will be more consistent and have lower TCC as compared to PMN-based capacitors.

The buried capacitors of the invention, buried one or two tape layers below the top of the substrate, have been subject to the HHBT reliability test (85° C./85% RH/50 VDC) for over 1000 hours with no degradation of the capacitance, dielectric loss or insulation resistance (IR) of the buried capacitors.

The above co-fired multilayer ceramic circuit boards having buried capacitors of the invention are useful in various applications, such as cellular telephones.

Although the invention has been described by way of certain specific embodiments, one skilled in the art will be able to substitute other green tape compositions, conductor layers, capacitor compositions and lamination and firing conditions; such variations are meant to be included herein and the invention is meant to be limited only by the scope of the appended claims.

We claim:

1. A supported ceramic circuit board having buried capacitors comprising a laminated green tape stack on a kovar support, a buried screen printed capacitor made from a dielectric selected from the group consisting of barium titanate and lead-magnesium niobate, a silver conductor layer printed below and above the capacitor, and an overlying green tape layer.

2. A supported ceramic circuit board according to claim 1 wherein said capacitor is made from barium titanate.

3. A fired ceramic circuit board of claim 2 wherein said capacitor is made from barium titanate.

4. A supported ceramic circuit board according to claim 1 wherein said capacitor is made from lead-magnesium niobate.

5. A supported ceramic circuit board according to claim 4 wherein said capacitors are sandwiched between two barium titanate barrier layers of sufficient thickness so as to prevent diffusion of glasses of the green tape into the capacitors.

6. A fired circuit board of claim 4 wherein said capacitors are sandwiched between two barium titanate barrier layers of a thickness so as to prevent diffusion of glasses of the green tape into the capacitors.

7. A capacitor ink comprising a dielectric, selected from the group consisting of barium titanate and lead-magnesiumniobate, a low firing temperature glass that includes less than 2% of barium oxides; and an organic vehicle.

8. A capacitor ink according to claim 1 wherein the dielectric is barium titanate which is mixed with a low temperature firing glass that does not include barium oxide so that the firing temperature of the mixture is below about 900° C.

9. A capacitor ink according to claim 7 wherein the dielectric is lead-magnesium-niobate which is mixed with a low firing temperature glass that includes less than 2% of barium oxide so that the firing temperature of the mixture is below about 900° C.

10. A multilayer ceramic tape stack comprising a plurality of low firing temperature green tapes that do not shrink in the x and y dimensions during firing having circuit patterns screen printed thereon and mounted on a metal support substrate, capacitors screen printed from a capacitor ink comprising a dielectric, selected from the group consisting of barium titanate and lead-magnesium-niobate; a low firing temperature glass that includes less than 2% of barium oxide; and an organic vehicle on a green tape layer, conductor layers screen printed above and below the capacitors and one or two green tape layers above the conductor layers above the capacitors.

11. A green tape stack according to claim 10 wherein said capacitors are of barium titanate and said conductor layers are of silver.

12. A green tape stack according to claim 11 wherein said silver conductor layers are made from a mixture of silver powder and silver flake.

13. A green tape stack according to claim 10 wherein said capacitors are of lead-magnesium niobate.

14. A green tape stack according to claim 13 wherein said capacitors are sandwiched between two barium titanate barrier layers, each having a thickness that prevents diffusion of the glasses of the green tape into the capacitors during firing.

15. A green tape stack according to claim 14 wherein said thickness is at least 16 microns.

16. A green tape stack according to claim 13 wherein said conductor layer is made from a mixture of silver powder and silver flake.

17. A multilayer ceramic tape stack comprising a plurality of low firing temperature green tapes that do not shrink in the x and y dimensions during firing having circuit patterns screen printed thereon and mounted on a metal support substrate, capacitors screen printed from a capacitor ink comprising a dielectric, selected from the group consisting of barium titanate and lead-magnesium-niobate; a low firing temperature glass that includes less than 2% of barium oxide; and an organic vehicle on a green tape layer, conductor layers screen printed above and below the capacitors and one or two green tape layers above the conductor layers above the capacitors, wherein said metal support substrate is made of a ferro/nickel/cobalt/manganese alloy.

18. A fired ceramic circuit board having buried capacitors comprising a laminated green tape stack on a kovar support, a buried screen printed capacitor made from a dielectric selected from the group consisting of barium titanate and lead-magnesium niobate, a silver conductor layer printed below and above the capacitor, and an overlying green tape layer.

* * * * *